Figure 1:
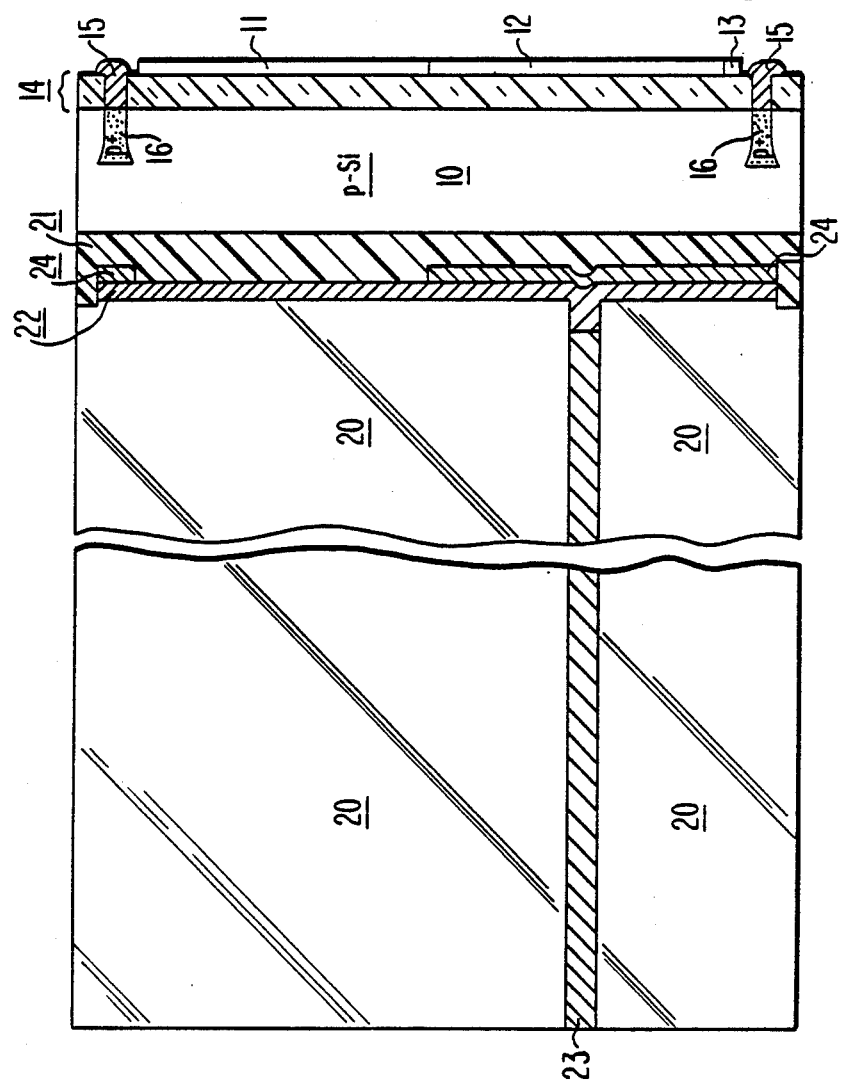

United States Patent [19]

Savoye

[11] Patent Number: 4,716,447
[45] Date of Patent: Dec. 29, 1987

[54] INTERRUPTING CHARGE INTEGRATION IN SEMICONDUCTOR IMAGERS EXPOSED TO RADIANT ENERGY

[75] Inventor: Eugene D. Savoye, Lancaster, Pa.

[73] Assignee: RCA Corporation, Princeton, N.J.

[21] Appl. No.: 904,805

[22] Filed: Sep. 8, 1986

Related U.S. Application Data

[63] Continuation of Ser. No. 778,758, Sep. 20, 1985, abandoned.

[51] Int. Cl.⁴ .................. H01L 29/78; H01L 27/14; H01L 31/00; H01L 27/12
[52] U.S. Cl. ........................... 357/24; 357/23.15; 357/30; 357/49; 357/80
[58] Field of Search ............ 357/23.15, 24, 30, 49, 357/80

[56] References Cited

U.S. PATENT DOCUMENTS

| | | | |
|---|---|---|---|
| 3,576,392 | 4/1971 | Hofstein | 357/31 |
| 3,796,927 | 3/1974 | Boyle et al. | 357/24 R |
| 3,905,094 | 9/1975 | Ruggiero | 357/49 |
| 3,906,543 | 9/1975 | Smith et al. | 357/24 LR |
| 3,931,463 | 1/1976 | Levine | 178/7.1 |
| 4,010,319 | 3/1977 | Levine | 178/7.1 |
| 4,017,341 | 4/1977 | Suzuki et al. | 357/49 |
| 4,032,976 | 6/1977 | Levine | 178/7.1 |
| 4,040,092 | 8/1977 | Carnes | 358/213 |
| 4,044,374 | 8/1977 | Roberts et al. | 357/80 |
| 4,065,781 | 12/1977 | Gutnecht et al. | 357/23 I |
| 4,131,810 | 12/1978 | Knauer et al. | 357/24 LR |
| 4,266,334 | 5/1981 | Edwards et al. | 29/583 |
| 4,328,432 | 5/1982 | Yamazaki | 357/24 LR |
| 4,348,690 | 9/1982 | Jastrzebski et al. | 358/44 |
| 4,374,391 | 2/1983 | Camlibel et al. | 357/23 I |

Primary Examiner—Gene M. Munson
Attorney, Agent, or Firm—Joseph S. Tripoli; Allen LeRoy Limberg; Peter M. Emanuel

[57] ABSTRACT

Charge integration is selectively interrupted in a semiconductor imager with thinned substrate, by modulating the electric field normal to its back-illuminated surface. This suppresses smear generated during field transfer in certain types of imager when exposed to high-energy images, for example. The thinned substrate is cemented with an electrically insulating epoxy to a glass backing plate bearing a transparent electrode, the potential on which is varied to modulate the drift field.

12 Claims, 4 Drawing Figures

INTERRUPTING CHARGE INTEGRATION IN SEMICONDUCTOR IMAGERS EXPOSED TO RADIANT ENERGY

This is a continuation of application Ser. No. 778,758, filed Sept. 20, 1985, now abandoned.

The present invention relates to semiconductor imagers and, more particularly, to the interrupting of charge integration in such a semiconductor imager without resorting to interrupting the supply of radiant energy to it.

In using some types of semiconductor imagers, such as charge coupled device (CCD) types, one encounters the problem of normal video signal being contaminated with a smear component. This undesirable component is generated in response to brighter portions of a light image projected into the photosensing field register, or A register, during transfer of charge packets out of that register. This problem insofar as it concerns CCD imagers of the field transfer type is discussed in detail by P.A. Levine in U.S. Pat No. 4,010,319 issued Mar. 1, 1977 and entitled "SMEAR REDUCTION IN CCD IMAGERS". This smear component can be reduced in direct relation to shortening of the time taken for the transfer of charge out of the photosensing field register, but the improvements in transfer speed over the present practice (wherein the transfer takes up most of the NTSC field retrace interval) will at best fall appreciably short of the reduction by twenty to fifty times that is required to meet the demands of applications like TV broadcast cameras. Reduction of the transfer interval requires reduction of resistance or capacitance in the charge transfer devices or both. Reducing capacitance in these devices requires reduction in charge transfer device dimensions, which are already near the lower limits attainable by photolithography.

Levine in U.S. Pat. No. 4,010,319 describes detection of smear separate from normal video and its differential combination with normal video contaminated with smear, thereby, to develop response to normal video with smear suppressed. And in U.S. Pat. No. 4,032,976 issued June 28, 1977 also entitled "SMEAR REDUCTION IN CCD IMAGERS" he describes biasing the gate electrodes of a field-transfer type of CCD imager so as to drive its substrate into accumulation following A-register-to-B-register transfer to remove smear charge signals. The method of suppressing smear described by Levine in this latter patent is not practicable where buried channels are used in the A register for transferring charge packets descriptive of image pixels and where anti-blooming drains with fixed barrier heights lie between adjacent charge transfer channels, but buried-channel imager structure is favored because its output is free of surface-recombination noise. Also only a portion of the smear can be eliminated by this method. The apparatus in the earlier Levine patent involves analog storage of detected smear, and does not provide adequate suppression of smear when bright areas of the image move rapidly with respect to the column registration of the A register, or when a column crosses more than one bright area in the image.

Consequently, optical shutters have been used to interrupt radiant energy to a CCD imager during a field transfer in order to forestall generation of smear. This, despite the undesirable noise and bulk of the motor and linkage for actuating the shutter, and the need for supplying power to run the motor. There is, however, a desire to be able to interrupt the integration of the charge carriers generated in the photosensing A register of a field-transfer type of CCD for eliminating smear arising during unshuttered A-register-to-B-register transfer.

Semiconductor imagers of the general type which the present invention concerns are built using thinned substrates to facilitate back-illumination—i.e., illumination through the "back" surface opposite to the "front" surface on which the gate electrode structures are disposed. Typically, the semiconductor wafer on which the CCD imager dies are to appear in non-separated form is processed using standard photolithographic techniques and is then thinned to ten microns or so. The resultant delicate structure then has a glass backing plate epoxied to it to make a relatively sturdy structure, after which the individual CCD imager dies are separated from each other.

In these back-illuminated imagers the charge carriers, particularly those generated responsive to the blue end of the visible spectrum, in substantial measure arise in the "bulk" region between the back surface and the depth from front surface to which the depletion regions induced beneath the gate electrode structures extend. These charge carriers then migrate to the depletion regions induced just below the front surface by application of suitable potentials to the gate electrode structures. (While front and back surfaces are referred to with regard to the projection of optical images into the imager, these surfaces are respectively the top and bottom surfaces of the semiconductor profile as conventionally considered. The terms "depth," "beneath," and "just below" are with regard to this latter convention.)

The migration of the charge carriers generated by photoemission in the region between back surface and the depletion regions induced by the gate electrode voltages may be random. Or as known from U.S. Pat. No. 4,348,690 issued Sept. 7, 1982 to L. L. Jastrzebski and P. A. Levine and entitled "SEMICONDUCTOR IMAGERS" an internal drift field may be created to aid migration of the charge carriers in the direction towards front surface, this being done by decreasing the doping concentration gradient from back surface to front surface of the semiconductor imager. Jastrzebski and Levine in U.S. Pat. No. 4,481,522 issued Nov. 6, 1984, entitled "CCD IMAGERS WITH SUBSTRATES HAVING DRIFT FIELD", and assigned to RCA Corporation, describe an imager with internal drift field directed away from substrate front surface towards its back surface for forcing charge carriers generated outside depletion regions into the bulk.

J. E. Carnes in U.S. Pat. No. 4,040,092 issued Aug. 2, 1977 describes an electronic shutter for back-illuminated, thinned-substrate CCD imagers. The electronic shutter is useful for reducing smear during field transfer in field-transfer-type CCD imagers. The thinned substrate CCD imager has a drain region diffused into the back surface of its substrate. The back surface of the substrate has an insulating oxide layer on it, which layer in turn has a transparent electrode deposited on it. The transparent electrode is typically a transparent conductive oxide (TCO). When the integration of charge carriers is to be prevented, potential is applied to the transparent back electrode, which, through electrostatic induction, selectively creates a drift field for the charge carriers in a direction towards the back surface of the imager. Carnes describes a deep depletion region being induced in the substrate next to its back surface, and charge carriers collected by this region flowing to the drain region diffused into the back surface of the substrate and being drained off. Thus the charge resulting from photogeneration during field transfer interval is for the most part never collected in depletion regions induced in the front surface of the imager for implementing the CCD charge transfer processes, which processes are used to extract charge samples descriptive of the image for conversion to video output signal voltage.

The structures specifically described by Carnes are not easily accommodated by present imager manufacturing methods. The Carnes structure uses individually thinned imager substrates for each imager, each of which has individually defined back-surface insulating oxide and transparent electrode layers. This requires photolithographic processes which must be kept in alignment with front-surface photolithographic processes. This registration is difficult to achieve in part because the thinned portion of the wafer tends to stretch and warp, so it is no longer plane. Forcing the wafer to be plane with vacuum or wax hold-down techniques increases the risk of front surface damage that will impair CCD operation. The high temperature processing to emplace drain regions in the imager back surface, as described by Carnes, must take place after thinning. This means that top metallization on the front surface of the imager cannot be completed before thinning, which further complicates registering the front-surface and back-surface photolithographic processes. There is an excessive amount of processing of thinned-substrate structures, which are fragile and thus apt to fracture during the processing so as to substantially reduce manufacturing yield.

With regard to a first aspect of the present invention, to eliminate the need for high-temperature processing of a thinned-substrate CCD imager die or a wafer array of unseparated imager dies, the back-surface drain regions(s) can be eliminated. Continuous integration of charge is still selectively interrupted by preventing the collection of charge carriers arising from photogenerative processes during the transfer of charge samples through the imaging portions (A registers) of the imagers. This is still done by applying potential to the transparent back electrode which creates a potential field gradient such that charge carriers in the bulk tend to migrate to the back surface of the semiconductive substrate. The surface recombination at this back surface reduces carrier lifetime to less than a microsecond, which the present inventor points out means that a negligible portion of the carriers collected at the back surface during the transfer interval of one millisecond or so survive to cause transfer smear, even if carriers collected at the back surface of the imager are not drained away. That is, more 99% of those charge carriers recombine, so drains for these carriers are not needed.

During times when charge integration in the depletion regions under the gate electrodes of the imager is not forestalled, but is allowed to resume, the potential applied to the transparent back electrode is altered so there is no appreciable drift field towards the back surface of the imager. Indeed, preferably the altered potential causes a drift field towards the front surface of the imager that accelerates charge carriers generated by photo conversion towards the front surface of the imager. The resultant shorter time before the carriers are collected into the depletion regions induced under the front surface gate electrodes reduces the time the carriers can diffuse in directions having components parallel to this surface. This permits the imager substrate, while being thinned, to be thick enough that most of the radiant energy does not reach the depletion regions induced in the front surface of the imager, but without unacceptably reducing image resolution. Then, most of the generation of charge carriers by photoconversion in the A register portion of the substrate can take place in the bulk, rather than in the depletion regions, where charge integration is fait accompli. The varying drift fields described above may be established essentially by electrostatic induction alone, by modulating the back electrode potential, or there may an internal drift field bias in either direction caused by changing doping gradient in the semiconductive substrate.

The inventor finds that the type of structure he proposes immediately above still presents a problem of being made practically, using conventional semiconductor integrated-circuit fabrication techniques. The semiconductor wafer comprising the unseparated imager dies is a very delicate structure after its having been thinned, so much so that manufacturing yield is severely affected if one attempts to perform photolithographic processes on the thinned wafer. But if the insulating layer and the transparent back electrode are constructed on the back surface of the semiconductor wafer, there is a need for defining the back electrodes on each of the imager dies, so that when the dies are separated, the back electrode structures do not extend to the edges of the dies. If they do, the fringing electric field will lead to an undesirably low voltage breakdown condition which interferes with the alternating potentials applied to the back electrodes being large enough to create the desired drift fields.

The key to practical manufacture is to form the transparent electrode layer, later separated into the imager back electrodes, on the glass backing plate, rather than on the thinned semiconductor wafer. The transparent electrode can be, e.g., a transparent conductive oxide (TCO) coating of the surface of the glass backing plate that is to adjoin the back surfaces of the imager dies. This structure is easily sturdy enough to permit the photolithographic processes required to define the boundaries of the back electrodes to be well away from the edges of the image dies after their later separation from each other. The insulating layer between the back electrodes and the back surfaces of the imagers is then provided by using an electrically insulative cement (a number of suitable epoxies being well known) to join the glass backing plate to the thinned semiconductor wafer.

Figure 2:
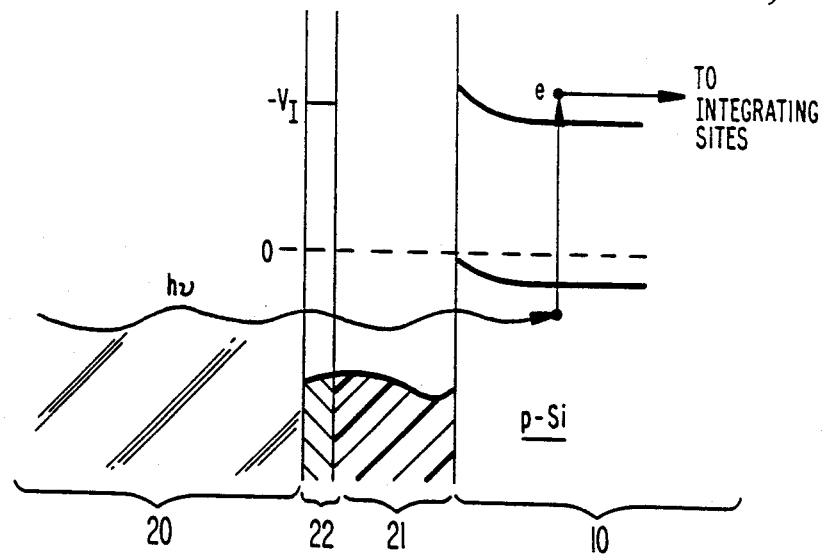
Figure 3:
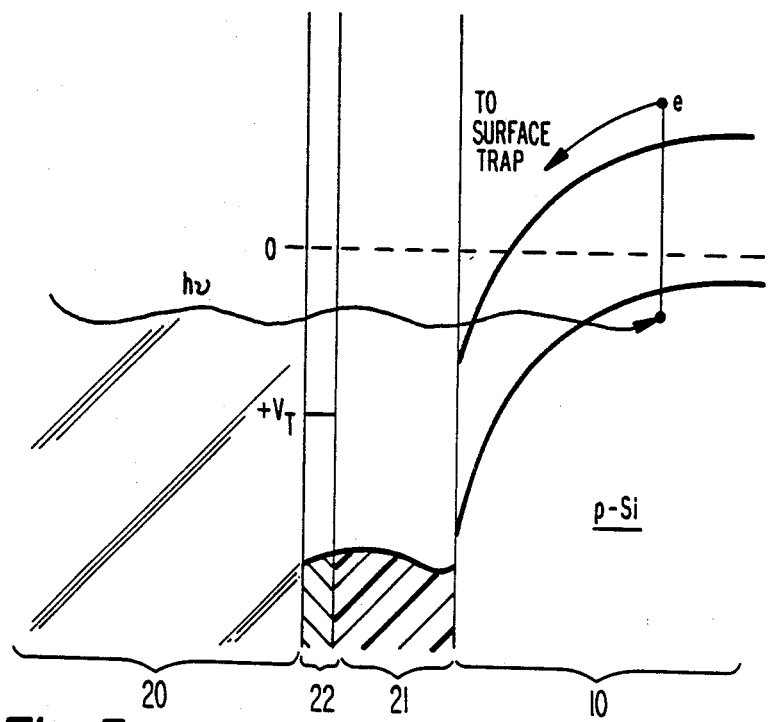
Figure 4:
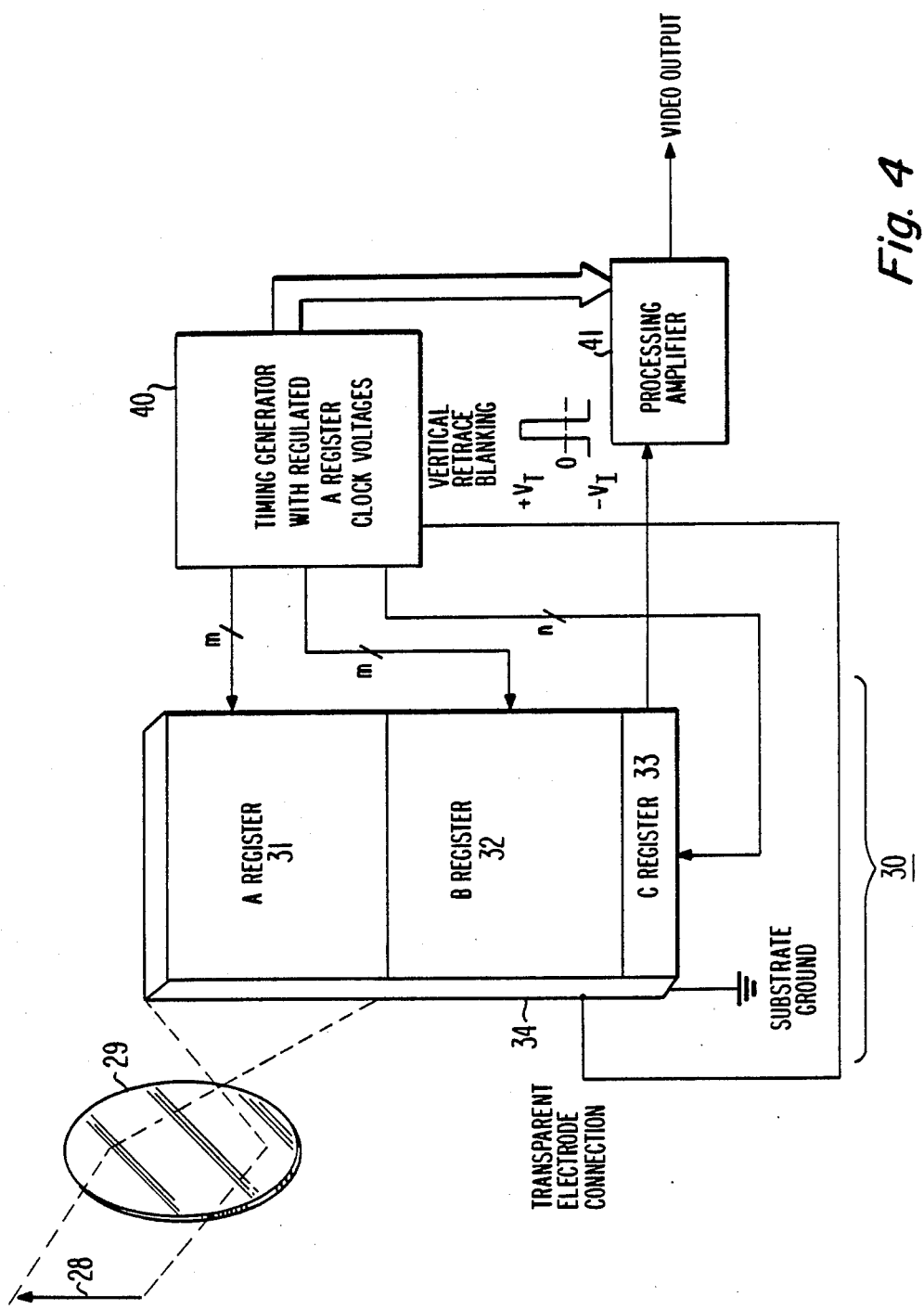

In the drawing:

FIG. 1 is a sketch of the profile of a field-transfer CCD imager constructed in accordance with an aspect of the invention;

FIGS. 2 and 3 are electron energy diagrams descriptive of operation during image integration and during field transfer, respectively; and FIG. 4 is a schematic diagram of a television camera including a field-transfer CCD imager constructed in accordance with the aspect of the invention described in connection with FIG. 1 and operated in accordance with further aspects of the invention to suppress smear tending to arise during field transfer.

The FIG. 1 sketch is not to scale; the horizontal dimensions in particular are greatly expanded relative to the vertical dimensions, to accommodate drafting limitations. A thinned silicon substrate 10 (from which sectioning indications are omitted for clarity of illustration) is originally a portion of a silicon wafer, thinned except at its rim. Gate electrode structures (not shown in detail) defining a photosensitive image (or A) register 11, a field storage (or B) register 12, and a line read-out (or C) register 13 are diposed on an insulating layer 14 on the front surface of substrate 10. Substrate 10 may have the conventional buried-channel structures, not shown, or the CCD-imager may be operated with surface-channel charge transfer. Ground bus metallization 15 (e.g. aluminum) deposited on layer 14 substantially surrounds the imager and extends through contact openings in layer 14 to make ohmic contact to highly doped P+ regions 16 diffused into the P-type silicon substrate 10. A glass backing plate 20 (with sectioning indications omitted for clarity of illustration) is a portion of a 0.5 mm or so thickness glass wafer. This glass wafer fits against the thinned portion of the silicon wafer and is laminated to the back surface of substrate 10 and its like in the silicon wafer after thinning and before dicing. A layer 21 about 2 microns thick of transparent electrically insulating cement, an epoxy, is used for this lamination process, which precedes separation of the CCD imager dies by standard sawing or ultrasonic cutting processes.

In the usual construction procedure, thinning of the semiconductive wafer is followed by a diffusion into the surface newly exposed by thinning, to create a drift field at this surface and normal to it that prevents charge carriers generated in the bulk from reaching the surface. This keeps the carriers from recombining at unpredictable rates and generating surface recombination noise. This high temperature diffusion process must be done before the top metallization is put on the imagers. At the same time the photolithographic process used for controlling the selective etching of the top metallization to form interconnection busses and bonding pads should not be used on the delicate thinned wafer. So top metallization is deposited and selectively etched after the lamination of the glass backing plate to the thinned portion of the semiconductor wafer.

The primary departure from the usual fabrication technique used to make the structure as thus far described is the preparation of the glass backing plate before lamination with the silicon wafer. Contact openings are made through the glass at locations that will in the lamination fall in portions of the CCD imagers outside the optical paths towards their image, or A registers. These openings may be made by etching or by ultrasonic cutting, for example. The surface to be joined by lamination to the silicon wafer is coated with a transparent conductive oxide (TCO) from which the transparent electrode structure 22 will be formed. The TCO may, for example, be indium and tin suboxides laid down by vapor deposition to a thickness of a few hundred Angstrom units, which TCO is familiarly known as TIC (thin iridescent coating). The TCO will partially fill the contact opening through which a conductive contact 23 will ultimately extend. The TCO layer is then divided into individual back electrode structures 22, etc. for respective ones of the semiconductor imagers on the silicon wafer, this being done by conventional photolithographic procedures. The back electrode structures are made to have boundaries well back from the edges of the imager dies when they are subsequently separated, so that there will be no voltage breakdown to the silicon substrate 10 at the edge of the imager attributable to fringing fields from the back electrode structure 20.

The conductive contact 23 to the surface of the backing glass plate 20, opposite to the surface which the conductive electrode 22 coats, and its likes are then formed by filling the contact openings from this opposite surface with conductive material ohmically contacting the TCO. A silver-filled epoxy has been successfully used for this purpose, though an indium solder or other conductive material might be used instead.

Where the opaque mask for shielding the B and C registers from the image is to be external to the CCD imager (that is, to the left of the FIG. 1 imager) the surface of the glass backing plate coated with TCO is simply cemented to the side of the silicon wafer containing the back surfaces of the CCD imager dies, using an electrically insulating cement, such as an epoxy. Where the opaque mask is external to the imager, there is a tendency for some of the image to reach under the mask and cause a penumbra effect. It is preferable to place in the laminar structure an opaque mask 24 as shown in FIG. 1 and (described in particular below) to largely avoid penumbra effect. This mask 24, assuming it to be of a material that is not a good electrical insulator, should not extend too close to the edge of the die boundary of substrate 10, so that electrical breakdown at the edge of the die is avoided. The surface of the glass backing plate with its TCO and mask layers is then cemented to the back surface of the semiconductor wafer with the electrically insulating cement.

Putting the transparent electrode or the mask, or both, on the thinned silicon wafer would be an exceedingly delicate operation. But putting the one or the both on the glass backing plate before laminating to the silicon wafer, in accordance with the invention, is relatively easy to do. The electrically insulating cement fills in around the edges of the TCO layer 22 (and mask layer 24, if used) so the edges of the imager between glass backing plate 20 and substrate 10 are filled with electrically insulating material to forestall voltage breakdown at these edges when voltages large enough to establish the described drift fields in substrate 10 are applied to layer 22 (and layer 24, if used).

The mask 24 has an aperture to permit light coming from the far left to back-illuminate A register 11. Mask 24 can be provided for by vacuum evaporation of 500 Angstrom units or so of chromium onto the indium-tin-oxide layer from which electrode 22 is formed, prior to the photolithographic steps used to etch away metallization on the glass backing plate in the areas near imager die edges. The 500 Å thickness is more than enough to be opaque to light; the extra thickness reduces the possibility of pinholes. The opening for the A registers in mask 24 and its likes could be provided for by standard photo-etch techniques but controlling the depth of etching so it does not extend too far into the TCO can be tricky. This tricky procedure can be avoided by including a photo-resist process before evaporation of the chromium to leave photo-resist over the area of the TCO to which the A-register window is to be etched. This photo-resist is removed together with that over the B and C registers after the A-register window is etched.

Interestingly, the A-register window surrounded by the opaque chromium mask 24 facilitates making correct optical alignment of the backing plate glass wafer with the substrate wafer during the lamination process. The run-out across the substrate 10 for this alignment is not supercritical, as would be the case in mask alignments for an integrated circuit manufacturing process, and can be as large as a few microns.

Since the back electrode allows one to apply drift field to the bulk of the imager substrate, which field prevents carriers generated in the bulk from reaching the back surface of the imager substrate to generate surface recombination noise, there is no need for a high-temperature diffusion process after the semiconductor wafer is thinned to create a drift field for this purpose. Avoiding high-temperature processing after thinning the semiconductor wafer permits a processing variant wherein top metallization is emplaced before thinning.

FIG. 2 is an electron energy diagram descriptive of the operation of the FIG. 1 CCD imager during image integration. A potential $-V_I$, measured with respect to substrate 10 ground potential, is applied to transparent electrode 22. Electrostatic induction accumulates the p-Si substrate 10 next to the insulating epoxy layer 21. This causes a bending of the conduction band to which a charge carrier e is lifted by radiant energy excitation H$\sigma$. This bending is negativeward (up) in potential at the back surface of substrate 10, applying an accelerating field towards integrating sites at the right for charge carrier e. Collection of charge carrier e at the integration sites formed by depletion regions induced in the front surface of substrate 10 is thus facilitated.

FIG. 3 is an electron energy diagram descriptive of the FIG. 1 CCD imager during field transfer. A potential $+V_T$ is applied to transparent electrode 22. Electrostatic induction depletes the p-Si substrate 10 next to the insulating epoxy layer 21. This causes a bending of the conduction band to which the charge carrier e is lifted by radiant energy excitation hv, which bending creates a surface trap at the back surface of substrate 10. The accelerating field towards this trap impels the energized charge carrier e into the surface trap and it cannot escape to reach the integrating sites by random diffusion.

To allow $V_I$ to be the same polarity as $V_T$, substrate 10 can have a doping gradient normal to its front surface for introducing a bias drift field into the substrate.

FIG. 4 shows a television camera in which smear tending to arise during field transfer is suppressed in accordance with aspects of the invention. Smear response to white light has been reduced about ten times in preliminary tests, using field-transfer CCD imagers constructed with ten micron thick p-Si substrates using the TCO electrode on the glass backing plate. Improvement, particularly at the red end of the spectrum should be possible with somewhat thicker thinned substrates. In FIG. 4 the image of an object 28 (shown as a vertical lance) is introduced by way of a lens system, represented by the simple convex lens 29, into the back surface of the CCD imager 30. Imager 30 is of the general type shown in FIG. 1 and has its substrate grounded. Its A register 31, its B register 32 and its C register 33 are per convention provided m-phase, m-phase, and n-phase clocking voltages respectively from a timing generator 40; m and n are each a small whole number, and they may or may not be equal to one another. Timing generator 40 supplies the conventional signals such as horizontal and vertical blanking, synchronizing pulses, equalizing pulses where field interlace is used, etc., to a conventional processing amplifier 41 to which output video samples from C register 33 are delivered for conversion to a standard-format video output signal.

Timing generator 40 is especial in only two regards. The m-phase clock voltages it supplies the A register 31 are regulated to control the depths to which the depletion regions induced next to the A register 31 gate electrodes extend into the imager substrate, so that the charge carriers are generated for the most part short of these depletion regions, where their diffusion to the depletion regions can be controlled. During the time that both A register 31 and B register 32 are forward-clocked to effectuate field transfer (extending by way of example over the vertical retrace interval) the voltage $+V_T$ is applied to the transparent electrode connection 34 to deplete the back surface of the imager 30 semiconductor substrate, trapping charge carriers generated by the photoemissive response to image radiant energy, and thus preventing the generation of smear. During times other than this field transfer, timing generator 40 supplies the voltage $-V_I$ applied to transparent electrode connection 34 to accumulate the back surface of imager 30 semiconductor substrate.

The present invention is useful not only in forestalling smear arising from forward-clocking of the A register during A-register-to-B-register transfer. It is useful as well in forestalling smear arising from reverse-clocking of the A register to transfer charge packets to an end drain or to a second B register at opposite end of the A register from the first B register. Reverse-clocking of the A register is useful in certain brightness compensation and electronic shutter applications. See, by way of example, P. A. Levine's U.S. Pat. No. 3,931,463 issued Jan. 6, 1976 entitled "SCENE BRIGHTNESS COMPENSATION SYSTEM WITH CHARGE TRANSFER IMAGER." See also the concurrently filed U.S. patent application Ser. No. 439,995 of E. M. Rentsch and L. A. Freedman entitled "APPARATUS FOR SENSING TRANSIENT PHENOMENA IN RADIANT ENERGY IMAGERS."

While the invention has been described in the context of a CCD imager of field transfer type, it will be readily appreciated that the invention is generally useful for interrupting the integration of charge in depletion regions induced in one surface of a semiconductor substrate, which charges are generated in the substrate bulk. In applications rather than back-illuminated imagers, the electrode on the opposing surface need not be transparent.

What is claimed is:

1. In combination:

a semiconductor substrate uniformly thin in its entirety and having opposed first and second surfaces;

means for generating charge carriers in the bulk of said substrate;

means for inducing an array of depletion regions in a portion of the first surface of said substrate, said depletion regions having a tendency to collect said charge carriers;

a backing plate of glass which is relatively thick as compared to said uniformly thin semiconductor substrate so as to provide structural support to said thin semiconductor substrate and including a vapor-deposited and photolithographically-shaped electrode structure in direct contact with a first surface thereof without any layer of cement in contact with said electrode structure on the side of said electrode structure facing said backing plate;

a layer of insulating cement of a material different than glass for cementing said first surface of the thick backing plate with electrode structure already in place thereon to the second surface of said semiconductor substrate, with an alignment such that said electrode structure opposes said array of depletion regions; and means for applying potentials between said semiconductor substrate and said electrode structure for selectively suppressing said tendency.

2. The combination as set forth in claim 1 wherein:
said array of depletion regions comprise an image register portion of said semiconductor substrate;
said electrode structure is optically transparent so as to allow an incident light image to pass therethrough onto said image register portion of said semiconductor substrate; and
said backing plate includes a vapor-deposited and photolithographically-shaped mask structure on its first surface for substantially blocking the passage of said incident image therethrough, said mask structure opposing said semiconductor substrate in substantially all of its surface area except that portion which includes said array of depletion regions.

3. The combination recited in claim 1 wherein said insulating cement is epoxy.

4. A semiconductor imager of the type having a substrate thinned in its entirety, in an image register portion of which thinned substrate charge carriers may be generated by photoresponse, and having a transparent backing plate of glass which is relatively thick as compared to said thinned substrate so as to support said substrate and which is co-extensive with the back surface of said substrate and laminated thereto by a layer of insulating cement of a material different than glass; improved to include a vapor-deposited and photolithographically-shaped transparent electrode in direct contact with a front surface of said transparent backing plate facing said substrate without any layer of cement in contact with said electrode on the side of said electrode plate facing said backing plate; said transparent electrode having a shape so that it is opposite the image register portion of said substrate and an additional portion of the substrate, and extending to outside boundaries sufficiently within the edges of said layer of insulating cement to avoid voltage breakdown to said substrate being appreciably reduced by fringing field effects; and further improved to include electrical contacts extending from the surface of the transparent backing plate facing said substrate, within the area of said additional portion of the substrate, facing said substrate, through said transparent backing plate to the opposite surface of the transparent backing plate.

5. A semiconductor imager, as set forth in claim 4, which is a CCD imager of field transfer type.

6. The combination recited in claim 4 wherein said insulating cement is epoxy.

7. A field transfer charge-coupled device (CCD) imager of the type having a substrate thinned in its entirety, said substrate having a front surface along which an image register is disposed and having a back surface at which back surface recombination of charge carriers reaching said back surface will take place, in said image register portion of which thinned substrate charge carriers may be generated by photoresponse, and having a transparent backing plate of glass which is relatively thick as compared to said thinned substrate so as to provide support to said substrate by being laminated to the back surface of said substrate by a layer of optically transparent and electrically insulating cement of a material different from glass; improved to include a vapor-deposited and photolithographically-shaped transparent electrode in direct contact with a front surface of said transparent backing plate facing said substrate without any layer of cement in contact with said electrode on the side of said electrode facing said backing plate, said transparent electrode having a shape so that it is opposite the image register portion of said substrate and an additional portion of said substrate and extending to outside boundaries sufficiently within the edges of said layer of insulating cement to avoid voltage breakdown to said substrate being appreciably reduced by fringing field effects; and further improved to include electrical contacts extending from the surface of the transparent backing plate facing said substrate, within the area of said additional portion of the substrate, through said transparent backing plate to the opposite surface of the transparent backing plate; and operated for suppressing generation of smear during field transfer using a method comprising the steps of:

back-illuminating said imager with a radiant energy image, and varying the potential at said transparent electrode for depleting the region of said substrate adjacent to said layer of insulating cement and opposite to said transparent electrode during the times said field transfer takes place, for causing surface recombination at the back surface of the substrate of essentially all of the charge carriers generated during those field transfer times.

8. The combination in claim 7 wherein said insulating cement is epoxy.

9. An imager having a substrate of semiconductive material with opposing front and back plane parallel surfaces, having a number of registers including an image register, having a back electrode separated from the back surface of its substrate by a both optically transparent and electrically insulative layer, and being one of the products of a three-part manufacturing process—the first part of said three-part manufacturing process comprising the steps of:

processing a wafer of said semiconductive material to form on its top surface an array of the respective registers of individual imagers, without top-metallization, the front surfaces of said imager substrates corresponding to portions of said wafer top surface;

thereafter depositing a layer of top-metallization on the top surface of said semiconductor wafer;

thereafter selectively etching the layer of top-metallization to form interconnection busses and bonding pads prior to separating said integrated circuits;

thereafter thinning at least a central portion of said semiconductive wafer by removing semiconductive material from its original bottom surface to expose a new bottom surface, the back surfaces of said imager substrates corresponding to portions of the new bottom surface of said wafer and;

thereafter avoiding high temperature processing as would adversely affect the selectively etched layer of top-metallization—the second part of said three-part manufacturing process comprising the steps of:

preparing a backing plate of optically transparent and electrically insulative material, which backing plate has a thickness between first and second plane-parallel surfaces thereof so as to be structurally supportive as compared to the thinned semiconductive wafer, and which backing plate is dimensioned on its first surface to fit against the thinned central portion of said semiconductive wafer;

opening contact holes in that backing plate between its first and second surfaces at a plurality of sites for providing contacts for respective ones of said back electrodes;

depositing an electrically conductive coating on the first surface of said backing plate, which coating is optically transparent at least below the image registers of said imagers when manufacturing of them is completed;

then, filling the contact holes through said backing plate with conductive material for providing contacts on its second surface for said back electrodes on its first surface; and then, removing by selective etching at least those portions of said electrically conductive coating which are to be in propinquity with the boundaries of the individual imagers, thereby to define back electrodes—the third part of said three-part manufacturing process taking place after each of said first and second parts and comprising the steps of:

laminating the selectively coated first surface of said backing plate to the new bottom surface of said semiconductor wafer with a cement that hardens to form a layer comprising both the optically transparent and electrically insulative layers of said imagers; and thereafter, separating said imagers from each other and remnant portions of said semiconductor wafer.

10. An imager as set forth in claim 9 wherein said electrically conductive coating is at least partially a multilayer one, having an optically opaque layer except under said image register and having an optically transparent layer.

11. An imager having a substrate of semi-conductive material with opposing front and back plane-parallel surfaces, having a number of registers including an image register, having a back electrode separated from the back of its substrate by a both optically transparent and electrically insulative layer, and being one of the products of a three-part manufacturing process—the first part of said three-part manufacturing process comprising the steps of:

processing a wafer of semiconductive material to form on its top surface an array of the respective registers of individual imagers, without top-metallization, the front surfaces of said imager substrates corresponding to portions of said wafer top surface;

thereafter thinning at least a central portion of said semiconductive wafer by removing semiconductive material from its original bottom surface to expose a new bottom surface, the back surfaces of said imager substrates corresponding to a portion of the new bottom surface of said wafer; and diffusing a dopant into the new bottom surface of said semiconductor wafer after its thinning to cause an internal drift field for forestalling surface recombination at the new bottom surface—the second part of said three-part manufacturing process comprising the steps of:

preparing a backing plate of optically transparent electrically insulative material, which backing plate has a thickness between first and second plane-parallel surfaces thereof so as to be structurally supportive as compared to the thinned semiconductive wafer, and which backing plate is dimensioned on its first surface to fit against the thinned central portion of said semiconductive wafer;

opening contact holes in that backing plate between its first and second surfaces at a plurality of sites for providing contacts to respective ones of said back electrodes;

depositing an electrically conductive coating on the first surface of said backing plate, which coating is optically transparent at least below the image registers of said imagers when manufacturing of them is completed;

thereafter, filling the contact holes through said backing plate with conductive material for providing contacts on its second surface for said back electrodes on its first surface; and then, removing by selective etching at least those portions of said electrically conductive coating in propinquity with the boundaries of the individual integrated circuits, thereby to define said back electrodes—the third part of said three-part manufacturing process taking place after each of said first and second parts of said three-part manufacturing process and comprising the steps of:

laminating the selectively coated first surface of said backing plate to the new bottom surface of said semiconductor wafer with a cement that hardens to form a layer comprising the optically transparent and electrically insulative layers of said imagers;

thereafter depositing a layer of top-metallization on the top surface of said semiconductor wafer;

thereafter, selectively etching the layer of top-metallization to form interconnection busses and bonding pads; and thereafter separating said imagers from each other and remnant portions of said semiconductor wafer.

12. An imager as set forth in claim 11 wherein said electrically conductive coating is at least partially a multilayer one, having an optically opaque layer except under said image register and having an optically transparent layer.

* * * * *